United States Patent [19]

Maszara

[11] Patent Number: 5,250,454
[45] Date of Patent: Oct. 5, 1993

[54] METHOD FOR FORMING THICKENED SOURCE/DRAIN CONTACT REGIONS FOR FIELD EFFECT TRANSISTORS

[75] Inventor: Witold P. Maszara, Columbia, Md.

[73] Assignee: Allied Signal Inc., Morris Township, Morris County, N.J.

[21] Appl. No.: 988,584

[22] Filed: Dec. 10, 1992

[51] Int. Cl.$^5$ ............... H01L 21/336; H01L 21/3205
[52] U.S. Cl. ........................................ 437/41; 437/46; 437/99; 437/101; 437/193; 148/DIG. 1; 156/633; 156/653; 156/657
[58] Field of Search ............ 437/41, 46, 99, 101, 437/187, 193, 186, 191; 148/DIG. 1; 156/633, 653, 657

[56] References Cited

U.S. PATENT DOCUMENTS

| | | | |
|---|---|---|---|
| 4,329,699 | 5/1982 | Ishihara et al. | 204/192.25 |
| 4,442,591 | 4/1984 | Haken. | |
| 4,462,847 | 7/1984 | Thompson et al. | 437/99 |
| 4,590,663 | 5/1986 | Haken. | |
| 4,638,347 | 1/1987 | Iyer. | |
| 4,689,869 | 9/1987 | Jambotkar et al.. | |
| 4,789,644 | 12/1988 | Meda | 437/46 |
| 4,808,546 | 2/1989 | Moniwa et al. | 437/41 |
| 4,884,111 | 11/1989 | Nishino et al. | 257/35 |
| 4,897,150 | 1/1990 | Dooley et al. | 437/192 |
| 4,960,723 | 10/1990 | Davies. | |
| 4,965,219 | 10/1990 | Cerofolini | 437/40 |
| 4,966,861 | 10/1990 | Mieno et al. | 437/99 |
| 5,079,180 | 1/1992 | Rodder et al. | 437/44 |
| 5,114,874 | 5/1992 | Custode. | |

FOREIGN PATENT DOCUMENTS

| | | | |
|---|---|---|---|
| 59-189677 | 10/1984 | Japan | 437/99 |
| 61-220419 | 9/1986 | Japan | 437/99 |

OTHER PUBLICATIONS

Wolf, et al., Silicon Processing, Lattice Press, 1986, vol. 1, pp. 175-180, 529-533.

*Primary Examiner*—T. N. Quach
*Attorney, Agent, or Firm*—Howard G. Massung

[57] ABSTRACT

A method for the self-aligned thickening of the source and drain contact regions (24,26) in which an amorphous silicon layer (40) is deposited over the gate (16), source contact region (24), the drain contact region (26), and side wall spacer (20) of an FET being fabricated on a substrate silicon layer (14). The amorphous layer (40) is heated to induce epitaxial growth in the source contact region (24) and drain contact region (26). The induced epitaxial growth of the amorphous silicon thickens these contact regions allowing for the subsequent formation of a highly conductive contact silicide for the cases where the available volume of the silicon in the contact areas is limited. The uncrystallized silicon is removed from the side wall spacer (20) of the gate and other insulating areas by a selective wet etch.

15 Claims, 2 Drawing Sheets

METHOD FOR FORMING THICKENED SOURCE/DRAIN CONTACT REGIONS FOR FIELD EFFECT TRANSISTORS

TECHNICAL FIELD

The invention is related to the field of making field effect transistors and, in particular, to a method for making a field effect transistor having thickened source and drain contact regions.

BACKGROUND ART

The self-aligned silicidation of the source and drain contacts used in silicon metal-oxide semiconductor field effect transistors (MOSFET) technology consumes a significant portion of the layer of the substrate silicon and forms a relatively rough interface with the underlying silicon. This roughness of the silicide/silicon interface along with the significant consumption of the silicon layer can adversely affect the structure of the transistor in the vicinity of the formed silicide drain and source contacts in both bulk silicon and silicon-on-insulator (SOI) transistors. In the case of a shallow junction (less than 200 nanometers), in bulk or SOI process, the encroachment of the contact silicide into the depletion region of the junction can cause excessive leakage currents. In the case of very thin SOI, the silicidation of the contact regions can lead to full consumption of the silicon film under the contact and a separation between the contact and the channel of the transistor.

To avoid these problems, thinner silicide contact regions may be used. However, this adversely compromises the resistivity of the silicide contact layer.

In devices having very shallow junctions and/or ultra thin silicon-on-insulator layers, less than 50 nanometers thick, the use of thinner silicides ceases to be a valid alternative.

One solution to this problem, as taught by S. S. Wong et al. in their article "Elevated Source/Drain MOSFET", published in the IEDM TECHNICAL DIGEST 634 (1984) and by M. Rodder et al. in their article "Raised Source/Drain MOSFET With Dual Sidewall Spacers", published in the IEEE ELECTRON DEVICE LETTER, 12(3), 89 (1991) is to thicken the silicon source and drain contact areas by selective chemical vapor deposition (CVD) silicon epitaxial growth after the formation of the poly-silicon gate and side wall spacers, and prior to the deposition of a refractory metal on these contact regions for the subsequent formation of the silicide contacts. FIGS. 1A, 1B and 1C show the processing steps disclosed by the prior art to thicken the source and drain contact regions prior to depositing the refractory metal over the drain and source contact regions.

FIG. 1 shows the structure of a field effect transistor on an SOI substrate prior to thickening the source and drain regions. As shown, the SOI substrate consists of an oxide layer 12 formed on a substrate 10, and a crystalline silicon layer 14 less than 200 nanometers thick formed on the silicon oxide layer 12. In the alternative, a bulk silicon substrate may be used in place of the SOI substrate which eliminates both the oxide layer 12 and the silicon layer 14. In the bulk case, subsequent references to the silicon layer 14 will imply the entire silicon substrate. A polysilicon gate 16 is formed on a thin gate oxide layer (not shown) on the silicon layer 14. A silicon nitride layer 18 is formed on top of the polysilicon gate 16, and a silicon dioxide ($SiO_2$) side wall spacer 20 is formed on the sides of gate 16. The silicon side wall spacer 20 circumscribes the polysilicon gate 16.

The thickness of the silicon layer 14 in the source contact region 24 and the drain contact region 26 is increased by 100 to 300 nanometers by selective chemical vapor deposition (CVD) epitaxially grown silicon layer 28 as shown in FIG. 1B.

The epitaxially grown silicon layer 28 grows faceted leaving V-shaped grooves 32 and 34 outside of the side wall spacer 20. During the formation of the silicide contacts, the silicide is likely to penetrate into the silicon layer 14 at the bottom of the grooves 32 and 34 toward the underlying source and drain junction. In the case of a thin silicon layer of a silicon-on-insulator substrate, the formation of the silicide could erode or consume the silicon layer 14 completely. To prevent the deposition of the refractory metal, used to form the silicide, on the bottoms of the V grooves 32 and 34, the prior art process requires the formation of a second side wall 36 to mask the V grooves as shown in FIG. 1C.

The second side wall 36 prevents the silicide contacts subsequently formed on the source and drain contact regions from penetrating the junction in the silicon layer 14 in a bulk silicon process, and from fully consuming a part of the silicon layer 14 adjacent to the bottom of the V groove in the case of a silicon-on-insulator (SOI) process.

The invention is a method for increasing the thickness of the source and drain contact regions which replaces the selectively grown silicon epitaxial layers with solid phase epitaxial regrowth of a deposited amorphous layer.

SUMMARY OF THE INVENTION

The invention is a method for thickening the source and drain contact regions of a field effect transistor being produced on a thin silicon layer on an insulating substrate or on a bulk silicon substrate with shallow source and drain junctions. The method consists of the steps of depositing a layer of amorphous silicon covering the gate, the side wall spacers, the source contact region and the drain contact region, then heating the layer of amorphous silicon to a temperature sufficient to induce epitaxial regrowth of the amorphous silicon on the source and drain contact regions. The induced epitaxial regrowth thickens the source and drain contact regions typically by 100 to 300 nanometers. The substrate is then selectively wet-etched to remove the remaining uncrystallized silicon over the side wall spacers and any other amorphous insulator surfaces. The side wall spacers may be partially or fully removed by the wet etch which can leave a groove exposing the substrate silicon layer adjacent to the gate. Another side wall spacer is formed to fill the groove and cover the exposed substrate silicon layer to prevent a subsequently formed silicide layer on the source and drain contact regions from penetrating the substrate silicon layer on the opposite sides of the gate. This prevents the subsequently formed silicide layer from encroaching the depletion region of the junction and causing excessive leakage currents; or severing the contact area from the channel area in the case of thin silicon-on-insulator transistors.

One advantage of the disclosed method is that the thickening of the source and drain contact regions is self-aligned, eliminating the need for special masks.

Another advantage of the method is that the amorphous silicon layer can be deposited using simple and inexpensive vacuum deposition equipment, eliminating the need for expensive and complex chemical vapor deposition equipment.

These and other advantages of the method disclosed herein will become more apparent from a reading of the specification in conjunction with the drawings.

DETAILED DESCRIPTION OF THE INVENTION

Figure 1A:
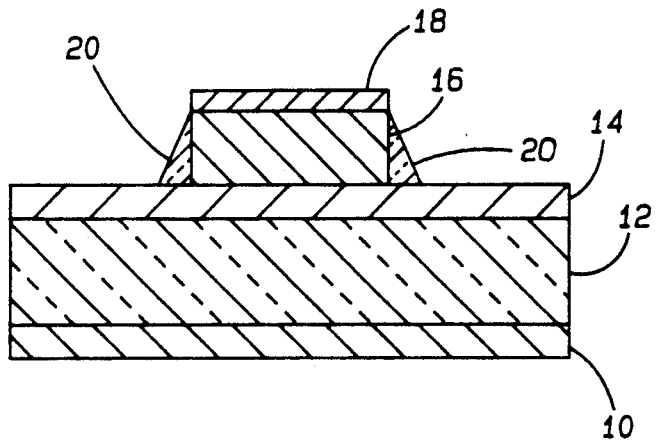
FIGS. 1A through 1C show the progressive structure of a silicon-on-insulator (SOI) field effect transistor during the thickening of the source and drain contact regions as taught by the prior art.
Figure 2A:
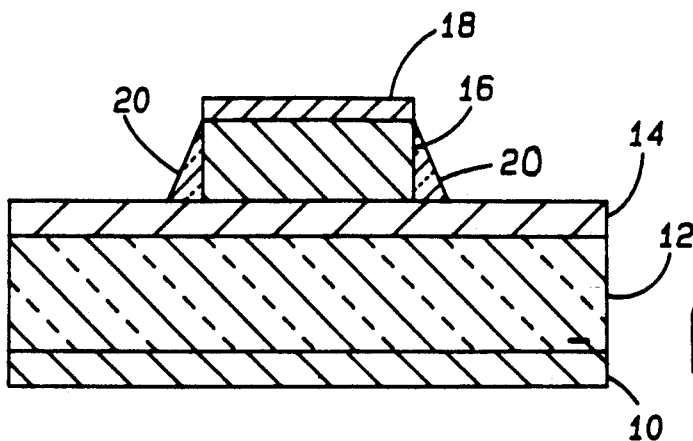
FIGS. 2A through 2D show the progressive structure of a silicon-on-insulator (SOI) field effect transistor resulting from the disclosed method for increasing the thickness of the source and drain contact regions.

FIGS. 2A through 2D show the progressive change in structure resulting from the process of thickening the source and drain contact regions of a field effect transistor prior to the deposition of a refractory metal used to form silicide contacts. FIG. 2A shows the structure of a field effect transistor prior to the thickening of the source and drain regions. This structure is identical to the structure shown in FIG. 1A and therefore the corresponding components and layers have the same reference numerals.

Figure 1B:
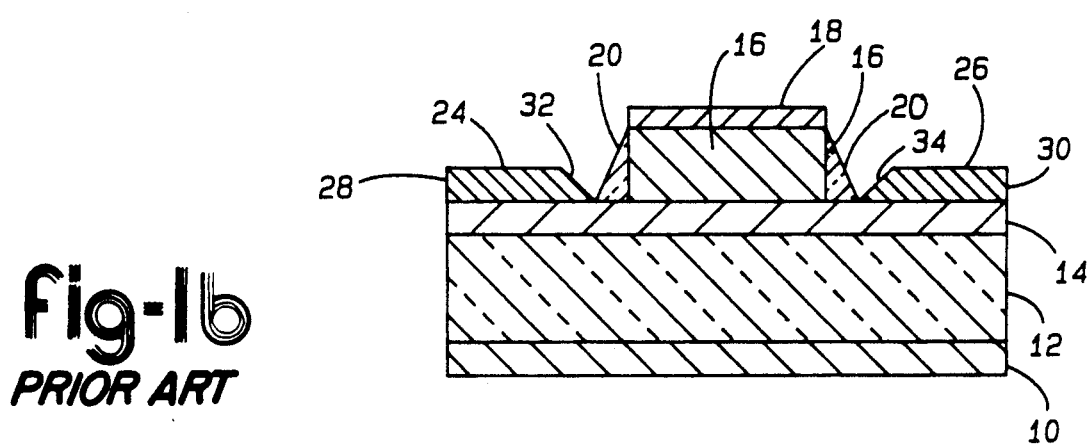
Figure 1C:
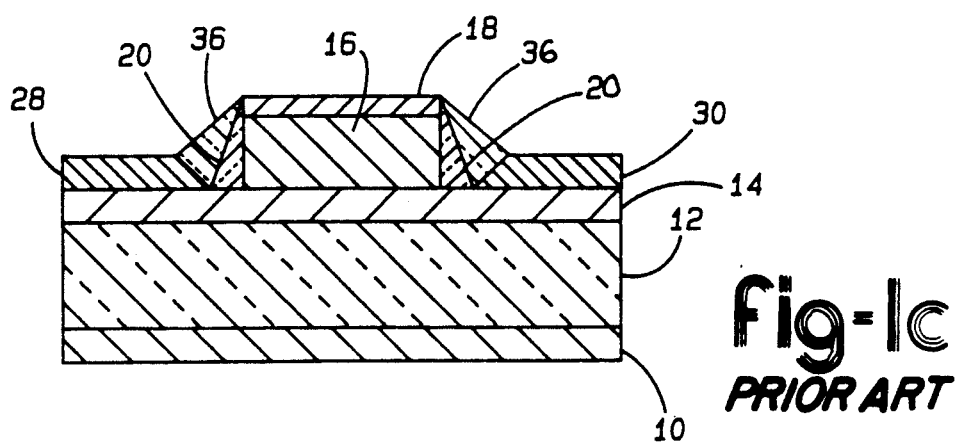

As in the previous embodiment described relative to FIGS. 1A through 1C, the silicon-on-insulator substrate comprises a silicon substrate 10, an oxide layer 12 and a thin crystalline silicon layer 14. Alternatively, the layer of crystalline silicon may be formed on any substrate such as a quartz substrate or a bulk silicon substrate as is known. In the case of the bulk silicon substrate, the oxide layer 12 and the silicon layer 14 are not required.

Figure 2B:
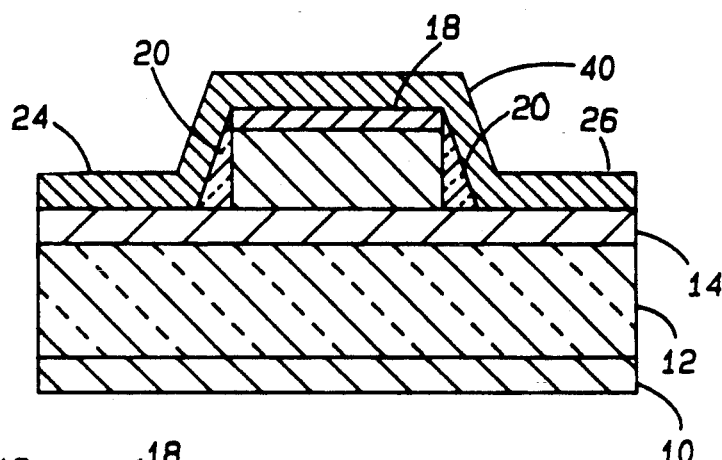

The process of thickening the source and drain regions begins by depositing a layer of amorphous silicon 40 over the gate 16 having a nitride cap 18, the side wall spacer 20 and the source and drain contact regions 24 and 26 as shown in FIG. 2B. The thickness of the layer of amorphous silicon 40 is preferably in the range from 100 to 300 nanometers. This amorphous layer of silicon 40 may be deposited using an electron beam (e-beam) evaporating system, vacuum sputtering system or any type of vacuum deposition system known in the art.

Figure 2C:
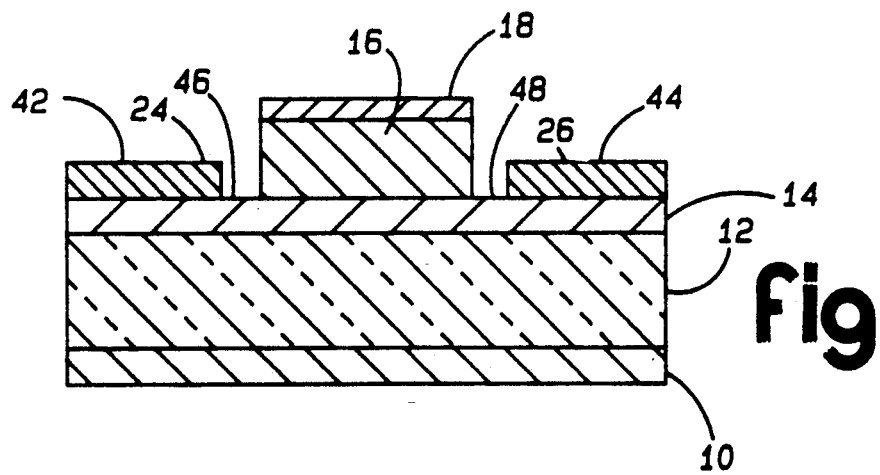

The deposited amorphous layer of silicon 40 is then annealed at an elevated temperature of approximately 550° C. to induce its epitaxial regrowth in the source and drain areas where the crystalline structure of the silicon layer 14 provides the required seed for crystallization of the overlaying amorphous silicon. The portions of the silicon layer 40 overlaying the silicon dioxide spacers 20 and the silicon nitride cap 18 due to the absence of a crystallization seed remains in an amorphous state. The portion of the silicon layer 40 remaining in the amorphous state is then removed by a selective wet etch such as a mixture of hydrofluoric acetic and nitric acids or any other selective wet etch known in the art. The portions 42 and 44 of the silicon layer in which epitaxial regrowth was induced are not removed by the selective wet etch and the crystallized areas remain as self-aligned thickening of the source and drain contact areas 24 and 26 as shown in FIG. 2C. The selective wet etch may fully or partially remove the silicon dioxide side wall spacers 20, leaving grooves 46 and 48 on the opposite sides of the poly-silicon gate 16.

Figure 2D:
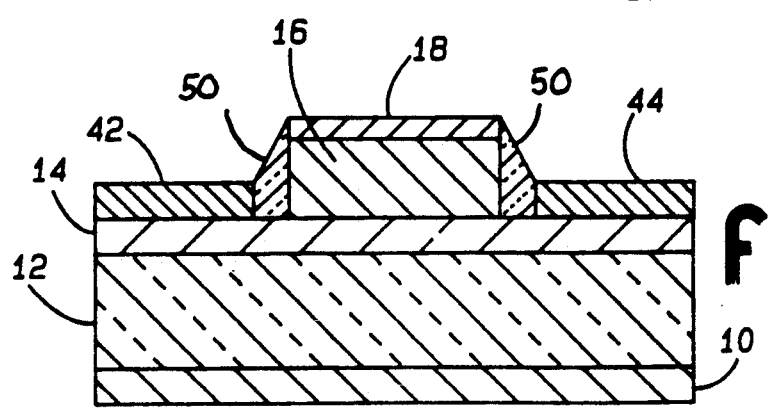

The grooves 46 and 48 are subsequently filled by side wall spacer 50, as shown in FIG. 2D to prevent the subsequent deposition of the refractory metal used for the formation of the silicide contacts on the source and drain regions 24 and 26, respectively, from being deposited on the exposed surfaces of the silicon layer 14 adjacent to the gate 16.

Preferably, the silicon dioxide side wall spacer 50 slightly overlap the edges of the thickened source and drain contact regions 24 and 26 to ensure that the refractory metal is not deposited into the grooves 46 and 48.

Having described the method for thickening the contact regions of the source and drain regions of a field effect transistor being formed on a substrate silicon layer of an insulating substrate, it is recognized that others skilled in the art may modify or improve the method within the scope of the invention set forth in the appended claims.

I claim:

1. A method for thickening the source and drain contact regions for a field effect transistor being formed on a silicon layer of a substrate, said silicon layer having a gate formed thereon intermediate said source and drain contact regions, said gate having a side wall spacer separating said gate from said source and drain contact regions, said method comprising the steps of:
    depositing a layer of amorphous silicon covering said source and drain contact regions, said gate and said side wall spacer;
    heating said layer of amorphous silicon to a temperature sufficient to induce epitaxial regrowth of said amorphous silicon layer in said source and drain regions to form thickened source and drain contact regions; and
    wet-etching said substrate to remove the uncrystallized portion of said amorphous silicon in the regions where epitaxial regrowth was not induced and to remove at least a portion of said side wall spacer leaving a groove circumscribing said gate.

2. The method of claim 1 further including the step of forming another side wall spacer filling said groove subsequent to said step of wet-etching.

3. The method of claim 1 wherein said gate is a polysilicon gate.

4. The method of claim 3 further including the step of forming a silicon nitride layer on top of said gate, said silicon nitride layer inhibiting induced epitaxial regrowth of said amorphous silicon layer on the top of said gate.

5. The method of claim 2 wherein said side wall spacer is a silicon dioxide side wall spacer, said step of wet-etching further includes etching away at least a part of said silicon dioxide side wall spacer.

6. The method of claim 1 wherein said step of depositing a layer of amorphous silicon comprises the step of depositing said layer of amorphous silicon by electron beam evaporation of silicon in a vacuum atmosphere.

7. The method of claim 1 wherein said step of depositing a layer of amorphous silicon comprises the step of depositing said layer of amorphous silicon by vacuum sputtering silicon.

8. The method of claim wherein said substrate is a silicon-on-insulator substrate.

9. The method of claim 1 wherein said substrate is a bulk silicon substrate.

10. The method of claim 1 wherein said step of heating includes the step of heating said layer of amorphous silicon to a temperature of approximately 550° C.

11. A method for thickening the source and drain contact regions of a field effect transistor formed on a substrate comprising the steps of:

forming a gate on said silicon layer between said source contact region and said drain contact region, said gate including a side wall spacer separating said gate from said source contact region and said drain contact region, respectively;

depositing a layer of amorphous silicon covering said gate, said source contact region, said drain contact region and the exposed surfaces of said side wall spacers;

heating said amorphous silicon to a temperature sufficient to induce epitaxial regrowth of said amorphous silicon layer on said source contact region and said drain contact region to form thickened source and drain contact regions;

wet-etching said substrate to selectively remove the portion of said amorphous silicon in the regions where epitaxial growth was not induced and to remove at least a portion of said insulator side wall spacer, said removal of said side wall spacer forming a groove circumscribing said gate, exposing said substrate silicon layer; and forming a second side wall spacer in said groove to prohibit a subsequently formed silicide on said source contact region and said drain contact region, respectively, from penetrating said silicon layer between said gate and said source and drain contact regions.

12. The method of claim 11 wherein said step of depositing a layer of amorphous silicon includes the step of electron beam evaporation of silicon to form said layer of amorphous silicon.

13. The method of claim 11 wherein said step of depositing a layer of amorphous silicon includes the step of vacuum sputtering silicon to form said layer of amorphous silicon.

14. The method of claim 13 wherein said step of heating includes the step of heating said layer of amorphous silicon to a temperature of at least 550° C.

15. The method of claim 11 wherein said step of forming a gate further includes the step of forming a silicon nitride layer on the top of said gate.

* * * * *